United States Patent Office 3,730,717

Patented May 1, 1973

3,730,717

PHOTOHARDENABLE ELEMENT WITH LIGHT-DEVELOPABLE DIRECT WRITING SILVER HALIDE OVERCOATING

Victor Fu Hua Chu, Wilmington, Del., and Abraham Bernard Cohen, Springfield, N.J., assignors to E. I. du Pont de Nemours and Company, Wilmington, Del.

No Drawing. Filed Mar. 28, 1969, Ser. No. 811,608

Int. Cl. G03c *5/04, 1/68, 11/12*

U.S. Cl. 96—27 R 10 Claims

ABSTRACT OF THE DISCLOSURE

An element comprising a light-hardenable layer upon which is coated a photodevelopable colloid silver halide emulsion. The photodevelopable silver halide emulsion is exposed, photodeveloped, and the image used as a negative to expose the underlying composition which is treated to remove the composition in unexposed, but not in exposed area. Printing reliefs suitable for letterpress and offset printing and printed circuits can be made from the elements of the invention, using wash-off procedures or thermal transfer means whereby unhardened image areas adhere to a previously or subsequently applied receptor sheet or plate.

BACKGROUND OF THE INVENTION

This invention relates to image-forming elements and to new processes for forming images. More particularly, it relates to a novel photographic element comprising a direct writing colloid silver halide emulsion overcoated on a photohardenable, e.g., a photopolymerizable, stratum.

Photopolymerizable compositions and elements as described in U.S. patents: Plambeck 2,720,163 and 2,791,-504; Barney 2,893,868; Martin 2,902,365; Martin et al. 2,927,022; Martin 2,929,710; Smith 3,012,952; Burg et al. 3,060,023 and 3,060,025; and Heiart 3,060,026 and 3,202,508, are useful in the preparation of photopolymer relief images. These compositions in addition to other photopolymerizable compositions to be hereinafter described, contain inter alia, addition polymerizable ethylenically unsaturated compounds, e.g., vinylidene and vinyl polymers, preferably of acrylic or alkacrylic esters and an addition polymerization initiator activatable by actinic radiation. The photopolymerizable element is exposed imagewise, e.g., through a separate light stencil, or photographic image bearing process transparency, to actinic radiation, which causes the ethylenically unsaturated compound to photopolymerize and become substantially insoluble in the exposed areas. Following exposure, the element is treated to remove the composition in the unexposed areas but not in the exposed areas. The resulting photopolymerized relief is useful as a planographic printing plate or a direct resist image. Thermal transfer processes are described in the last five-listed patents.

When using a photopolymerizable element as described above with a separate process transparency, difficulties are encountered in maintaining adequate uniform contact between the negative and the surface of the photopolymerizable element.

The use of conventional silver halide emulsions to image photopolymer systems upon which they are overcoated has been described in assignee's U.S. Pat. Smith, 3,245,793. The resulting polymerized relief images are quite good as printing reliefs or image transfer surfaces. The major drawback to such a system is slow access time, due to the need for additional wet processing for the silver halide emulsion.

SUMMARY OF THE INVENTION

An object of this invention is to provide new image-forming elements. Another object is to provide rapid access, high-speed imaging processes. A further object is to provide such elements which are simply prepared from readily available ingredients. Still further objects will be apparent from the following description of the invention.

The new image-forming elements of this invention comprise in order:

(1) a permanent or removable sheet or plate which can be flexible or rigid, (2) a solid photohardenable stratum having a weight of 1–90 (preferably 10–50) mg. per square dm. when dry and comprising (a) an addition polymerizable, nongaseous ethylenically unsaturated compound containing at least one terminal ethylenic group ($CH_2=C<$), having a boiling point above 100° C. at normal atmospheric pressure and being capable of forming a high polymer by free radical initiated chain propagating addition polymerization, or an addition polymerizable high molecular weight (>5,000) polymer, suitable such polymers are described in Martin, U.S. 2,892,716 and Martin, U.S. 2,929,-710; and (b) a preformed, compatible coherent film-forming macromolecular organic polymer having a molecular weight greater than 10,000 and being solid at 50° C., components (a) and (b) being present in amounts of 10 to 60 and 40 to 90 parts by weight respectively;

(3) a radiation-sensitive, water-permeable colloid light-developable, direct writing silver halide emulsion layer; and (4) optionally a removable support adherent to the silver halide layer.

The solid photohardenable stratum which is preferably photopolymerizable and thermally transferable at 40°–220° C. may contain (c) a free radical generating addition polymerization initiator activatable by actinic radiation, in an amount from 0.001 to 10 parts by weight of components (a) and (b) and optionally, (d) a thermal addition polymerization inhibitor in an amount from 0.001 to 6 parts by weight of components (a) and (b).

Other light-hardenable materials for layer (2) of the photohardenable layer is polyvinyl cinnamate, etc.

In general, the photopolymerizable stratum has a thickness between .00015 and .250 inch. Suitable supports and photopolymerizable layers for the coated elements of this invention are those defined and described in the patents listed above and in Alles, U.S. 2,779,684 and 3,043,695, and Heiart 3,060,026 and 3,202,508. The photopolymerizable elements thereof are provided with a thin hydrophobic copolymer layer and a silver halide emulsion, whereas, the instant photopolymerizable elements do not require a hydrophobic copolymer layer between the silver halide emulsion and the photopolymerizable stratum, but can use it optionally. An alternative embodiment has the silver halide emulsion coated on a thin polyester support, and then applied to the photohardenable layer such that the silver halide emulsion and the photopolymer are contiguous. This allows the silver halide layer to be removed prior to development of the exposed photohardenable layer.

If an intermediate copolymer layer is used, a thin gelatin layer of the conventional type and well-known in the art may be coated between the emulsion layer and the copolymer layer as described in the above Alles patents.

The silver halide emulsion is coated to give a coating weight of about 30–90 mg./dm.$^2$ of silver halide when dry. A thin antiabrasion layer may be coated subsequently over the colloid silver halide emulsion, as is common in the art. The water-permeable colloid silver halide emulsion is of the light-developable, direct writing type. Suitable such emulsions include those described in U.S. patents: Hunt 3,033,678 and 3,033,682, May 8, 1962, Bigelow 3,178,293, Apr. 31, 1965, Hunt 3,183,088, May 11, 1965, Hunt 3,189,456, June 15, 1965, and Sincius 3,241,962, Mar. 22, 1966, and Belgian Pat. 705,495.

In one aspect, the invention comprises a thermal transfer process for reproducing a light developed image on a photohardenable element of the invention comprising (a) an image receptor sheet laminated to a photopolymerizable layer before or after exposure;
(b) a photohardenable layer including a photopolymerizable layer containing image areas (underexposed) which are thermally transferable by having a stick or transfer temperature above 40° C. and below 220° C., the photohardenable stratum being solid below 40° C.;
(c) a photodevelopable colloid silver halide emulsion coated directly on said photohardenable layer; and
(d) a support, e.g., a film or plate.

A photopolymerizable element, as described above, with a permanent support and no support (d) is exposed to a radiation source to which the photopolymerizable layer is primarily sensitive and which radiation is modulated by the developed silver in the silver halide layer, the radiation passing through areas with little or no silver image. After exposure, the element is subjected (a) to thermal transfer of unexposed areas, or (2) to a suitable washout solution as disclosed in the patents set out above, which removes the silver halide emulsion layer as well as the unexposed portions. If an intermediate copolymer layer is used, it is peeled off prior to washout. If any thin water-permeable layers are present, e.g., subbing layers, they will washout along with the unexposed and unpolymerized adjacent areas of the original photopolymerizable stratum.

The photopolymerizable elements just described can be developed according to the thermal transfer development processes of Heiart, U.S. 3,060,026 and 3,202,508.

DESCRIPTION OF THE PREFERRED EMBODIMENTS

In general the invention uses a composite film element which comprises (a) an image receptor sheet, (b) a photohardenable layer including a photopolymerizable layer, (c) a photodevelopable colloid silver halide emulsion coated directly on the photopolymer layer, and (d) a support. This element is imagewise exposed to actinic radiation sufficient to sensitize the silver halide emulsion, which is then photodeveloped as set out in assignee's Hunt U.S. Pats. 3,033,682, 3,183,088 and Bigelow 3,178,293. The resulting image is used to imagewise expose the photohardenable layer, which is exposed sufficiently to actinic radiation to polymerize or harden throughout the entire thickness of photosensitive material in the exposed areas of the layer, while causing no substantial hardening in the under-exposed areas. The image receptor sheet is now either peeled off or thermally delaminated at a temperature of at least 45° C., and within the stick temperature of underexposed areas, which is at least 10° C. below the stick temperature of exposed areas. The exposed photohardened area has an adhesive value to a receptor of about 0.5 to 10 g./linear inch, and an adhesion value to the silver halide emulsion of the unexposed material of at least .15 gram/linear inch.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable systems are (1) ones in which a photopolymerizable monomer is present alone or in combination with a compatible binder, or (2)) those in which the photohardenable group, attached to a polymer backbone, becomes activated on exposure to light and may then crosslink by reacting with a similar group or other reactive sites on adjacent polymer chains. In the second group of suitable photohardenable systems, where the monomer or pendent photohardenable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

The term "underexposed" as used herein is intended to cover the image areas of the photohardenable layers which are completely unexposed or those exposed only to the extent that there is photohardenable compound still present in sufficient quantity that the molecular weight, and therefore the softening temperature, remains substantially lower than that of the complementary exposed imaged areas. The term "stick temperature" as applied to either an underexposed or exposed area of a photohardenable stratum means the minimum temperature at which the image area in question, sticks or adheres, within 5 seconds, under slight pressure, e.g., thumb pressure, to analytical paper (Schleicher and Schull analytical Filter Paper No. 595) and remains adhered in a layer of at least detectable thickness after separation of the analytical paper from the stratum.

In a preferred composite film element the base support is of a material which is stable at the operating temperatures of the element. The base support for the silver halide emulsion may be coated with a subbing composition as set out in Alles U.S. 2,779,684, Example IV. Where the image receptor sheet is opaque, it is necessary that the base support be transparent to actinic radiation so that the silver halide emulsion and the photopolymer layer may be successfully exposed.

If either a simple monomer or monomer-polymer binder system is being used, the element in the preferred process contains a free radical generating addition polymerization initiator in the photopolymerizable layer. In addition, particularly where a photo-crosslinkable polymer or dimer system is used the layer may also contain a plasticizing agent.

The receptor sheet or plate is determined by the product desired as the result of the process of the invention. The receptor sheet, preferably should have low permeability to oxygen and must be thermally stable in the range of operating temperatures.

Suitable free radical initiated, chain propagating addition polymerizable ethylenically unsaturated compounds for use in the simple monomer or monomer-polymer binder photopolymerizable layers are described in Burg et al. U.S. Pat. 3,060,023; Celeste et al. 3,261,686; and in assignee's Cohen and Schoenthaler U.S. Pat. 3,380,831. Polymers for use in the monomer-polymer binder system and preferred free radical generating addition polymerization initiators are described in U.S. Pat. 3,060,023, Photodimerizable materials useful in the invention are cinnamic acid esters of high molecular weight polyols, polymers having chalcone and benzophenone type groups, and others disclosed in chapter 4 of "Light Sensitive Systems" by Jaromir Kosar published by John Wiley and Sons, Inc., New York, 1965. Photopolymerizable materials capable of photocrosslinking with more than one adjacent polymeric chain to form a network are described in Schoenthaler, U.S. Pat. 3,418,298, and in U.S. application Ser. No. 477,016 by J. R. Celeste filed Aug. 3, 1965, now abandoned.

Preferred free radical generating addition polymerization initiators, activatable by actinic light, e.g., ultraviolet and visible light are set out in U.S. 3,060,023 and the other patents referred to above. The initiator combination compositions of photographic silver halide sensitizing agents and bromine donor compounds or reducing aliphatic amines of Belgian Pats. 682,048 and 682,052, Dec. 5, 1966 are also useful in the photopolymerizable layers of this invention as are the lophine dimers disclosed in Chambers, U.S. Pat. 3,479,185, and the triarylimidazolyl dimers and p-aminophenyl ketones of Chang and Fan U.S. Pat. 3,549,367.

Where the polymer is a hard high melting compound, a plasticizer is usually used to lower the glass transition temperature and facilitate cohesive failure in the underexposed areas. The plasticizer may be a monomer itself e.g., a diacrylate ester, or any of the common plasticizers which are compatible with the polymeric binder. Among the common plasticizers are polyethylene glycol, phosphate esters, e.g., triphenyl phosphate, and phthalates, e.g. dibenzyl phthalate.

The photohardenable layer thickness can vary according to its composition and the intended use. A preferred range is .0001" to .002", but with some polymeric binders, much greater thicknesses can be used.

The various dyes, pigments, thermographic compounds and color forming compounds which may be included directly in the photopolymerizable layer are disclosed in U.S. 3,060,026. In addition, the above-mentioned patent also discloses both organic and inorganic filler materials which may be included in the sensitive layer to achieve desired physical characteristics in the layer.

As mentioned above the receptor sheet material will be determined by its imperviousness to oxygen where oxygen-sensitive photohardenable materials are used, and by the end use to which the process of the invention will be put. Materials such as polyethylene terephthalate, glass, various types of paper, metal sheets, foils, e.g., aluminum, copper, etc., may be used as receptor sheets.

The silver halide emulsions of this invention are preferably of the silver bromide or silver chlorobromide type, but other types, i.e. chloride, iodobromide, etc. can be used. Suitable emulsions are described in Hunt U.S. 3,249,440; 3,189,456; 3,183,088; 3,033,682; 3,033,678; Bigelow U.S. 3,178,293 and Sincius U.S. 3,241,962 and Belgian Pat. 705,495.

In place of part or all of the gelatin used in the enumerated examples there can be substituted other natural or synthetic water permeable organic colloid binding agents. Such agents include water soluble or water permeable polyvinyl alcohol and its derivatives e.g., partially hydrolyzed polyvinyl acetates, polyvinyl ethers and acetals containing a large number of extralinear —$CH_2CHOH$— groups, hydrolyzed interpolymers of vinyl acetate and unsaturated addition polymerizable compounds such as maleic anhydride, acrylic and methacrylic acid ethyl esters, and styrene. Suitable colloids of the last mentioned type are disclosed in U.S. Pats. 2,276,322, 2,276,323 and 2,397,866. Useful polyvinyl acetals include polyvinyl acetaldehyde acetal, polyvinyl butyraldehyde acetal and polyvinyl sodium-o-sulfobenzaldehyde acetal. Other useful colloid binding agents include the hydrophilic copolymer of N-acrylamido alkyl betaines described in Shacklett U.S. Pat. 2,833,650 and hydrophilic cellulose ethers and esters. Further the emulsion may contain quantities of water insoluble latex particles, e.g., acrylic and methacrylic ester polymers and copolymers, butadiene/styrene copolymers etc.

The silver halide direct writing emulsions may contain any of the well known optical sensitizing dyes such as cyanines, carbocyanines, merocyanines, etc.

The silver halide emulsion can be exposed through any transparent or translucent base support, e.g., heat set, biaxially oriented polyethylene terephthalate, or paper. The element is photodeveloped using any of the techniques described in Hunt U.S. Pat. 3,033,682.

After the silver halide image has been photodeveloped, this image is used for imagewise exposure of the photopolymer. Light sources for exposure include tungsten lamps, quartz-halogen lamps, filtered mercury lamps, carbon arcs, mercury-vapor arcs, fluoroescent lamps with special ultraviolet light-emitting phosphors, argon glow lamps, electronic flash units and photographic flood lamps. The amount of exposure required for satisfactory reproduction of a given element is a function of exposure time, type of light source used, and distance between light source and element. The proper balance of these three variables for any given set-up is best determined by exposing and processing stepwedge test strips.

After the exposure of the photohardenable layer, the cover sheet is delaminated from this layer at an elevated temperature. The heat required to maintain the element at an operating temperature above 45° C. and between the stick temperatures of the exposed and underexposed areas of the photohardenable layer may be applied at any time after exposure and before or at the time of delamination as long as the element is at the required operating temperature during delamination. Heat can be applied by means well known to the art, e.g., rollers, flat or curved heating surfaces or platens, radiant sources, e.g., heating lamps etc. The preferred operating temperature range is 55° C. to 130° C.

After thermal delamination of the image receptor sheet, in the case where a clear, colorless photohardenable material is to be colored, or where it is desired to change certain physical properties, such as electrical conductance, hydrophilicity, etc., the photohardenable material on the cover sheet may be subjected to a dusting treatment similar to that disclosed in U.S. 3,060,024. Depending on the type of photohardenable material used, it may or may not be necessary to heat the element to soften the underexposed material to allow the dusted material to stick to it. Generally, however, better adhesion (in the case of a dusted colorant, higher color density) is affected when the cover sheet is heated to a temperature between 55° C. and 130° C., finely divided particles of the coloring or other materials are dusted onto the cover sheet while it is at the elevated temperatures, and after the cover sheet has cooled to room temperature the excess dust is removed. The dust particles will remain only in the unhardened image areas.

Another alternative after treatment that may be included in the process of this invention, which will accomplish a similar result is similar to the treatment described in 3,060,025. The image receptor sheet may or may not need to be heated to a temperature preferably between 55° C. and 130° C., but in either case it is pressed temporarily to a support that has on its surface a coating of loosely bound particulate matter. On separation from this surface, the loosely bound matter will adhere only to the unhardened image on the cover sheet.

The processes of this invention can make use of either the integral laminated receptor sheet described in assignee's V. F. Chu application No. 684,945, filed Nov. 22, 1967, now U.S. 607,264, or separate image receptive surfaces as described in U.S. 3,060,024 and 3,060,025. Materials which may be dusted or loosely bound to a separate surface are also disclosed in these two patents.

Instead of thermal transfer means, when the elements do not have a support (d) on the silver halide layer, after exposure, the element is processed to a low relief image by scrubbing, spraying, or washing, or any other means wih an aqueous alkali solution or an organic solvent mixture, usually for a period of 30 seconds to 10 minutes. The water-permeable coloid layer of the developed silver halide emulsion washes away along with the unexposed photopolymerizable composition in those applications where the silver halide emulsion has been coated directly onto the photopolymer or when it has been first coated to a paper support which acts as a cover sheet. If the silver halide has been coated upon an impervious support and then laminated to the photopolymer (silver halide emulsion contiguous with the photopolymer), the support must first be removed before the washout development step in order to obtain a high quality relief image.

As stated before, the photopolymerizable compositions, after exposure, can be developed, e.g., by washing, scrubbing and brushing, or impingement of spray jets to the desirable images with aqueous bases or organic solvents, depending on the photopolymer composition used and its application, e.g., some of the photopolymer compositions in assignee's Plambeck, U.S. 2,760,863, used an organic solvent mixture to develop relief images in the photopolymerizable element, while those in Smith, U.S.P. 3,245,793, Apr. 12, 1966, use as a washout developer an aqueous alkaline solution. When an aqueous alkaline solution is used as the developer, concentrations range from 0.01% to 10% by weight. Higher concentrations can be used, but no improved result is obtained thereby.

The solvent media used to develop the exposed plates are aqueous media, i.e., water is the major constituent. Preferred developers also contain an organic solvent and an alkaline material. Suitable organic solvents include isopropanol, butanol, diacetone alcohol, 1-methoxyethanol, 2-ethoxyethanol, and 2-n-butoxyethanol. Suitable alkaline materials include alkali metal hydroxide, sodium metasilicate, triethanolamine, morpholine, trisodium phosphate, etc. The developer may also contain a surface tension (wetting) agent, as well as dyes, and etchant salts to etch base metals.

It will be seen that this invention provides a simple, rapid method for producing an immediate viewing image, which can be later processed to a higher contrast and more stable relief image. The novel element of this invention also provides a method of producing a positive or a negative relief image directly from a positive or negative image in a single step, and using a single film element. Such an element has widespread applications in situations where an immediately viewable image is desired, which can later be processed to a permanent image.

The invention will be further illustrated by, but is not intended to be limited to the following examples, wherein the parts stated are by weight.

Example I

A direct writing iodine-gold sensitized gelatin silver bromide emulsion was prepared as disclosed in assignee's Sincius Belgian Pat. 705,495 and skim coated to .001-inch onto a .004-inch polyethylene terephthalate sheet (A) bearing a substratum as described in assignee's Alles U.S. Pat. 2,779,684.

The following composition was prepared.

| | | |
|---|---|---|
| Triacrylate of oxyethylated trimethylol propane prepared from Ex. I, U.S. 3,380,831 | g | 12 |
| Trichloroethylene | parts | 55 |
| 25% methyl methacrylate homopolymer in trichloroethylene | do | 36 |
| Methylene Blue C.I. 52030 | g | .1 |
| Polyoxyethylene lauryl ether, viscosity of 30 cp. at 25° C. | g | 1.3 |
| Triethanol amine | g | .5 |
| 10% trichloroethylene solution of polymethylmethacrylate/methylmethacrylate | parts | 10 |

This composition was coated in the dark to .001 inch directly on the cooled silver halide emulsion using a doctor knife to regulate the coating thickness. A 0.001-inch polyethylene terephthalate film (B) was laminated to the photopolymerizable layer.

The element was exposed for $\frac{1}{10,000}$ of a second (130 meter candle seconds). Exposure was through a $\sqrt{2}$ step-wedge filter on an Edgerton, Germeschausen and Grier Sensitometer (Model Mark VI), the silver halide emulsion facing the light source.

The element was then photodeveloped for 15 seconds on an Ansto Grid lamp at 120° C.

The element was then postexposed for 15 seconds at a distance of 16 inches from a 1000-watt Sylvania Sun Gun using a DXN Bulb. The unexposed image areas were thermally transferred or adhered to film (B) when passed between pressing rollers at 105° C. and at 7½ inches per minute. Film (A) was stripped with its adherent silver halide layer from the photopolymerizable stratum.

Example II

A direct writing silver halide emulsion was prepared as described in Example I of assignee's Hunt U.S. Pat. 3,033,682, and coated on .004-inch polyethylene terephthalate film (A) described in Example I, as well as on unsized paper to a dry silver bromide coating weights of 40 mg./dm.$^2$. The coated emulsions were dried.

The following composition was prepared.

| | | |
|---|---|---|
| Polyethylene glycol M.W. 4000 (average) | g | 0.30 |
| Cellulose acetate butyrate | g | 0.90 |
| Cellulose acetate | g | 0.45 |
| Pentaerythritol triacrylate prepared as in Ex. I, U.S. 3,261,686 | g | 3.0 |
| 15% carbon black suspension in isopropanol | g | 1.0 |
| Methylene Blue Chloride C.I. #52015 | g | 0.02 |
| Methanol | g | 1.1 |
| Acetone to | g | 20.0 |
| Triethanolamine | ml | 1.0 |

Integral films were prepared in the following manner.

(i) Approximately one quarter of the photopolymer was coated on .001-inch polyethylene terephthalate using a .006-inch doctor knife. After drying for ten minutes, this structure was laminated to the direct writing emulsion coated on paper, such that the paper side adjoins the photopolymer.

(ii) Approximately one quarter of the photopolymerizable composition was coated on the emulsion side of the direct writing/paper structure using a doctor knife spacing of 0.006-inch. After drying for ten minutes, the photopolymer was laminated to .001-inch polyethylene terephthalate film.

(iii) Approximately one quarter of the photopolymer composition was coated as in (i), and laminated with the direct writing emulsion coated on polyethylene terephthalate film, such that the base side adjoins the photopolymer.

(iiii) The remaining photopolymer composition was coated as in (i) and after drying for ten minutes it was laminated to the direct writing emulsion coated on polyethylene terephthalate film, such that the emulsion side adjoins the photopolymer.

These integral films were then exposed, photodeveloped and postexposed as in Ex. I. The images were then thermally transferred as in Ex. I. All provided satisfactory images.

As compared to a developing out emulsion applied to the photopolymerizable layer, this invention eliminates the developing out procedure and allows more rapid imaging with less work.

Example III

The following composition was prepared.

| | Wt. (g.) |
|---|---|
| Polymethylmethacrylate/methacrylic acid (90/10) | 300.0 |
| 2-o-chlorophenyl - 4,5 - bis-(m-methoxyphenyl) imidazolyl dimer | 11.2 |
| Tris-(4-diethylamino-o-tolyl) methane | 9.0 |
| 4,4'-bis-(dimethylamino) benzophenone | 6.0 |
| C.I. Solvent Red #109 | 6.0 |
| Mixed ester of triethylene glycol dicaprate and dicaprylate | 36.0 |
| Trimethylolpropane triacrylate | 114.0 |

The composition was thoroughly mixed by mechanical stirring, coated on a grained aluminum plate to a thickness of .00025" and dried.

An iodine-gold sensitized, silver bromide direct writing emulsion as disclosed in assignee's Belgian Patent 705,495, Apr. 23, 1968, was coated to a dry thickness of approximately 1 mil on the photopolymer plate, and dried.

The dried plates were given a 130-meter candle second (10–4 sec.) exposure through a $\sqrt{2}$ step wedge on an Edgerton, Germeshausen and Grier Sensitometer (Model Mark VI). The emulsion was then photodeveloped for 13 mins. under a 1.0 neutral density filter and for 3 minutes in room light.

The plate was then post-exposed for 10 seconds approximately 4" from a 500 watt tungsten light.

The plates were developed by washing out both the direct writing emulsion and the unexposed parts of the coatings using a solution of the following composition:

| | | |
|---|---|---|
| Trisodium phosphate ($Na_3PO_4 \cdot 12H_2O$) | gms | 25.0 |
| Sodium phosphate (monobasic $NaH_2PO_4 \cdot H_2O$) | gms | 4.4 |
| 2-butoxyethanol | ml | 55 |
| Surfactant (isooctyl phenyl polyethoxyethanol 10% by wt. aqueous) | ml | 2.0 |
| Water (distilled) to make | liter | 1.0 |

pH adjusted to 11.0.

A good image was obtained.

Post exposure times of 10–30 seconds also yielded good relief images, and the plate was suitable for wet offset printing after washing in hot water.

Example IV

A direct writing emulsion (Ex. III) was coated on a (.002) 2-mil biaxially oriented heat set polyethylene terephthalate support and laminated at 21° C. to a photopolymer plate prepared as in Ex. III. When the direct writing emulsion was cooled below its melting temperature, the polyester support was peeled off.

The emulsion was then given a 130 meter candle second exposure through a transparency for $10^{-4}$ secs. at 130 mcs. (on an E.G. and G. Mark VI Sensitometer) (Ex. III), and photodeveloped in room light for 20 minutes.

The photopolymer plate was postexposed in 3 equal areas for 30, 45, and 60 seconds approximately 4" from a 500-watt tungsten lamp.

Acceptable relief images were obtained in all 3 sections of the plate.

Example V

The following photoresist composition was prepared.

| | Parts by weight |
|---|---|
| Methyl methylacrylate homopolymer 0.20 inherent viscosity | 42.0 |
| Methyl methacylate homopolymer 1.20 inherent viscosity | 14.0 |
| Pentaerythritol triacrylate | 35.0 |
| Triethylene glycol diacetate | 5.0 |
| 2-tert. butylanthraquinone | 3.5 |
| 2,2-methylene bis-(4-ethyl-6-tert. butyl phenol) | 0.35 |
| Fast Brilliant Red-BL | 0.15 |

This composition is skim coated on a .004-inch polyethylene terephthalate support and dried at 71° C. Dry thickness is .0015-inch. The photopolymer is then laminated to a .005-inch copper sheet which has been treated in a solution of

| | Parts by weight |
|---|---|
| Pentaerythritol triacrylate | 7 |
| 2-tert. butylanthraquinone | ⅓ |
| Polymethyl methacrylate/methacrylic acid | 7 |

Methyl chloroform to make 1 liter.

The polyester was peeled off and the photopolymer was then overcoated with a lead-tin sensitized direct writing emulsion prepared as described in assignee's Hunt U.S.P. 3,033,682. The emulsion is pour coated to a thickness of approximately 1 mil (.001) and dried in a circulating hot air oven at 25° C.

The composite photopolymer element is exposed through a transparency for $10^{-4}$ sec. at 130 meter candle seconds on an Edgerton, Germeschausen and Grier Mark VI model sensitometer, and photodeveloped in room light for 31.5 minutes.

The element was then postexposed for 2 minutes approximately 4 inches from a 500-watt tungsten lamp.

The direct writing emulsion was washed off with warm water (23° C.), and the photopolymer developed with 1,1,1-trichloroethane.

The resulting positive photoresist image is of good quality, and is suitable for preparation of printed circuit boards.

Example VI

A gelatino-silver chlorobromide emulsion was prepared in the following manner. To an approximately 1% aqueous gelatin solution containing 1.5 moles of potassium chloride and .075 mole of hydrochloric acid there was added over a period of 25 minutes at a temperature of 140° F. one liter of a 1.5 molar solution of silver nitrate. The emulsion was held for 5 minutes and there was then added 160 mole percent of potassium bromide based on the silver. The emulsion was ripened for 40 minutes at 140° F. and cooled. The emulsion was washed by coagulation and redispersed in the manner described in Ex. I of Moede, U.S. 2,772,165. The gelatin concentration was raised to approximately 6.5% during which time the temperature was raised to and held at 130° F. At this point, 150 milligrams of the dye; 5,5'-dimethyl - 3,3',9 - triethyl benzselenazole carbocyanine iodide was added from a 1:1000 methanolic solution. The preparation of this dye is disclosed in U.S. Pat. 1,990,681. The emulsion was then held at 130° F. for 5 minutes and then there was added an aqueous solution of plumbous nitrate in an amount to provide one mole percent of lead based on the silver halide. Potassium bromide was added to give an excess of 30 mole percent of bromide ions based on the silver halide. The emulsion was again held for 5 minutes at 130° F. and then cooled to 95° F. Various coating aids including a hardener were added and the emulsion was coated directly onto a photopolymer composition prepared as in Ex. I.

The dried plates were exposed through a transparency on an Edgerton, Germeschausen and Grier Sensitometer (Mark VI model) for $10^{-4}$ secs. (130 meter candle seconds). The emulsion was then photodeveloped for 10 minutes in room light. The plate was then post exposed for 10 seconds approximately 4" from a 500-watt tungsten light. The plates were developed by washing out the unexposed areas with the solution described in Ex. III. A good relief image was obtained which was suitable for wet offset printing after washing in hot water.

Example VII

A photopolymerizable layer was coated on an aluminum plate and overcoated with a direct silver halide writing emulsion as in Example III. When dry, the element was exposed and photodeveloped as in Example III. Postexposure was for 5 seconds to a 500-watt tungsten lamp at a distance of 4 inches. Following postexposure, there was a five-minute delay after which the unexposed areas of the element were washed out as described in Example III.

The embodiments of the invention in which an exclusive property or privilege is claimed are defined as follows:

1. An element capable of forming a polymeric image without wet treatment comprising in order (a) a sheet or plate support, (b) a solid, ethylenically unsaturated, photohardenable stratum, and (c) a radiation-sensitive, light-developable, direct writing, water-permeable colloid silver halide emulsion layer.

2. An element according to claim 1, wherein said photohardenable stratum is photopolymerizable and comprises (a) an addition polymerizable, non-gaseous, ethylenically unsaturated compound containing at least one terminal ethylenic compound, having a boiling point above 100° C. at normal atmospheric pressure, and being capable of forming a high polymer by free radical initiated, chain propagating addition polymerization, (b) a preformed, compatible, coherent, film-forming, macromolecular, organic polymer having a molecular weight greater than 10,000 and being solid at 50° C., and (c) an addition polymerization initiator activatable by actinic radiation, components (a), (b), and (c) being present in respective amounts by weight of 10–60, 40–90, and 0.001 to 10 of components (a) and (b), respectively.

3. An element according to claim 2, wherein said addition polymerization initiator is a polynuclear quinone having two intracyclic groups attached to intracyclic carbon atoms for a conjugated carbocyclic ring.

4. An element according to claim 1 wherein said support is an aluminum plate.

5. An element according to claim 1 having (d) second support or image-receptor sheet adherent to the outer surface of stratum (c).

6. An imaging process comprising producing an image in the emulsion layer of the element of claim 1 and imagewise exposing the photohardenable stratum to actinic radiation transmitted by the non-image areas of the imaged emulsion layer.

7. A process according to claim 6 wherein the step of producing an image in the emulsion layer comprises, in order, (a) imagewise exposing the emulsion layer to actinic radiation, and (b) photodeveloping the image formed in the emulsion layer.

8. A process for forming a relief image comprising forming an image in a photohardenable stratum according to claim 6 and removing the unexposed areas of said stratum with developing solution.

9. A proces for forming a relief image comprising producing an image in the emulsion layer of the element of claim 5 imagewise exposing the photohardenable stratum to actinic radiation transmitted by the non-image areas of the imaged emulsion layer; and delaminating said second support or image-receptor sheet from the element, the unexposed areas of the photohardenable stratum adhering to said second support or image-receptor sheet to form a relief image.

10. An element according to claim 2 wherein said addition polymerization initiator is selected from methylene blue and methylene blue chloride.

References Cited

UNITED STATES PATENTS

| | | | |
|---|---|---|---|
| 3,097,096 | 7/1963 | Oster | 96—35.1 |
| 3,245,796 | 4/1966 | Smith | 96—68 X |
| 3,376,138 | 4/1968 | Gianguàlano et al. | 96—35.1 |
| 3,033,678 | 5/1962 | Hunt | 96—63 |
| 3,245,793 | 4/1966 | Smith | 96—68 X |

CHARLES L. BOWERS, Jr., Primary Examiner

U.S. Cl. X.R.

96—28, 35.1, 64, 68, 108, 115 P